US007001713B2

(12) United States Patent
Chen et al.

(10) Patent No.: US 7,001,713 B2
(45) Date of Patent: Feb. 21, 2006

(54) METHOD OF FORMING PARTIAL REVERSE ACTIVE MASK

(75) Inventors: Coming Chen, Taoyuan Hsien (TW); Juan-Yuan Wu, Hsinchu (TW); Water Lur, Taipei (TW)

(73) Assignee: United Microelectronics, Corp., Hsinchu (TW)

( * ) Notice: Subject to any disclaimer, the term of this patent is extended or adjusted under 35 U.S.C. 154(b) by 29 days.

(21) Appl. No.: 09/991,466

(22) Filed: Nov. 21, 2001

(65) Prior Publication Data

US 2002/0094493 A1 Jul. 18, 2002

Related U.S. Application Data

(63) Continuation of application No. 09/535,251, filed on Mar. 27, 2000, now abandoned, which is a continuation-in-part of application No. 09/075,618, filed on May 11, 1998, now abandoned.

(30) Foreign Application Priority Data

Apr. 18, 1998 (TW) ............................... 87105966 A

(51) Int. Cl.
   *G03F 7/00* (2006.01)
   *G03F 7/36* (2006.01)
(52) U.S. Cl. ...................... 430/317; 430/311; 430/313; 430/314; 430/316; 438/296; 438/424; 438/427; 438/692
(58) Field of Classification Search .................. 430/5, 430/311, 313, 314, 316, 317; 438/296, 424, 438/427, 692, 697
See application file for complete search history.

(56) References Cited

U.S. PATENT DOCUMENTS

| 4,256,829 | A | | 3/1981 | Daniel ........................ 430/312 |
| 4,268,951 | A | | 5/1981 | Elliott et al. ................ 438/289 |
| 5,130,213 | A | | 7/1992 | Berger et al. .................. 430/4 |
| 5,208,124 | A | | 5/1993 | Sporon-Fiedler et al. ...... 430/5 |
| 5,346,584 | A | | 9/1994 | Nasr et al. ................... 438/427 |
| 5,498,565 | A | * | 3/1996 | Gocho et al. ............... 438/427 |
| 5,801,083 | A | | 9/1998 | Yu et al. ..................... 438/424 |
| 5,851,899 | A | * | 12/1998 | Weigand ..................... 438/427 |
| 5,880,007 | A | * | 3/1999 | Varian et al. ............... 438/427 |
| 5,926,723 | A | | 7/1999 | Wang ......................... 438/437 |
| 5,926,733 | A | | 7/1999 | Heo ........................... 438/622 |
| 5,958,795 | A | | 9/1999 | Chen et al. ................. 438/692 |
| 5,969,425 | A | * | 10/1999 | Chen et al. ................. 257/774 |
| 6,004,863 | A | * | 12/1999 | Jang .......................... 438/427 |
| 6,046,106 | A | * | 4/2000 | Tran et al. .................. 438/660 |
| 6,057,210 | A | * | 5/2000 | Yang et al. ................. 438/427 |
| 6,103,592 | A | * | 8/2000 | Levy et al. ................. 438/424 |
| 6,169,012 | B1 | | 1/2001 | Chen et al. ................. 438/427 |
| 6,291,111 | B1 | * | 9/2001 | Chen et al. .................... 430/5 |
| 6,448,159 | B1 | * | 9/2002 | Chen et al. ................. 438/500 |
| 6,486,040 | B1 | * | 11/2002 | Chen et al. ................. 348/427 |
| 2002/0001919 | A1 | * | 1/2002 | Chen et al. ................. 438/424 |
| 2002/0094493 | A1 | * | 7/2002 | Chen et al. ................. 430/311 |

OTHER PUBLICATIONS

Merriam Webster's Collegiate Dictionary, 10th ed, pp. 952 (1998).

* cited by examiner

*Primary Examiner*—Nicole Barreca
(74) *Attorney, Agent, or Firm*—William J. Kubida; Peter J. Meza; Hogan & Hartson LLP

(57) ABSTRACT

A method of forming a partial reverse active mask. A mask pattern comprising a large active region pattern with an original dimension and a small active region pattern is provided. The large active region pattern and the small active region pattern are shrunk until the small active region pattern disappears. The large active region pattern enlarged to a dimension slightly smaller than the original dimension.

7 Claims, 4 Drawing Sheets

METHOD OF FORMING PARTIAL REVERSE ACTIVE MASK

CROSS-REFERENCE TO RELATED APPLICATION

The present application is a continuation of U.S. patent application Ser. No. 09/535,251, filed Mar. 27, 2000 now abandoned is a continuation-in-part of U.S. patent application Ser. No. 09/075,618, filed May 11, 1998 now abandoned which claim priority from Taiwan Application No. 87105966, filed Apr. 18, 1998, all the disclosures of which are herein specifically incorporated by this reference.

BACKGROUND OF THE INVENTION

1. Field of the Invention

The invention relates to a chemical-mechanical polishing (CMP) method applied in shallow trench isolation (STI), and more particular, to a chemical-mechanical polishing method incorporated with a partial reverse active mask applied in shallow trench isolation.

2. Description of the Related Art

For a very large scale integration (VLSI) or even an ultra large scale integration (ULSI), chemical-mechanical polishing is the only technique that provides global planaration. Since this technique greatly reduces feature size of an integrated circuit, the manufacturers rely on this technique for planarization process. A great interest to further develop this technique is evoked for further reduction in feature size and fabrication cost.

As the dimension of semiconductor devices becomes smaller and smaller, deep sub-half micron technique, for example, a line width of 0.25 $\mu$m, or even 0.18 $\mu$m, is used. To planarize the wafer surface by chemical-mechanical polishing, especially to planarize the oxide layer within in a trench, becomes more and more important. To prevent the formation of a recess on the surface of the oxide layer within a shallow trench isolation of a larger area, a reverse tone active mask is used in process. An etch back process is also performed to obtain a better chemical-mechanical polishing uniformity. However, a misalignment often occurs.

In a conventional process of forming a shallow trench isolation, since the active regions have different dimensions, the dimensions of shallow trench between active regions are different. In FIG. 1A to FIG. 1E, a cross sectional view of the process for forming a shallow trench isolation by chemical-mechanical polishing is shown. In FIG. 1A, a pad oxide layer 15 and a silicon nitride layer 16 are formed on a substrate 10. Using photolithography and anisotropic etching, a shallow trench 14 and an active region 12 are formed. The dimensions of the shallow trench 14 are various according to the various dimensions of the active region 12.

In FIG. 1B, using atmosphere pressure chemical vapor deposition (APCVD), an oxide layer 18 is formed over the substrate 10 and fills the shallow trench 14. Due to the topography of the shallow trench 14 within the substrate 10 and the characteristics of step coverage of the oxide layer 18, the surface of the deposited oxide layer 18 is undulating but smooth. A photo-resist agent is coated on the oxide layer 18. Using photolithography, a reverse tone active mask 20 is formed. The reverse tone active mask 20 covers the surface of the shallow trench 14 and becomes complementary to the active regions 20. It is known that during the formation of the reverse tone mask 20, a misalignment often occurs. Consequently, the reverse tone active mask 20 covers a range of the oxide layer 18 beyond the shallow trench 14.

In FIG. 1C, the exposed part of the oxide layer 18, that is, the part which is not covered by the oxide layer 18, is etched away until the silicon nitride layer 16 is exposed. The resultant structure of the oxide layer is denoted as 18a. As shown in the figure, the oxide layer 18a covers most of the shallow trench 14 and a small part of the silicon nitride layer 16 on the active region. In FIG. 1D, the reverse tone active mask 20 is removed. It is found that a recess 22, and an overlap 24 are formed since the oxide layer 18a does not cover the shallow trench 14 completely.

In FIG. 1E, the oxide layer 18a is polished by chemical-mechanical polishing until the oxide layer 18a has a same level as the silicon nitride layer 16. Since the oxide layer 18a formed by APCVD has a smooth profile, so that it is difficult to be planarized. In addition, it is obvious that the recess 22 is formed since the oxide layer 18a does not fill the shallow trench 14 completely. A kink effect is thus easily occurs by the recess 22. That is, a current leakage or a short circuit is caused. The yield of the wafer is affected.

SUMMARY OF THE INVENTION

It is therefore an object of the invention to provide a method of forming a shallow trench isolation by chemical-mechanical polishing incorporating a high density plasma chemical vapor deposition (HDP-CVD) with a partial reverse active mask. The shallow trench isolations have various dimensions in accordance with the dimensions of the active regions therebetween. An oxide layer formed by HDP-CVD has a pyramid-like profile on the active region. Therefore, this oxide layer is easier to be planarized by chemical-mechanical polishing than an oxide layer form by conventional APCVD. The central part of an oxide layer on an active region of a large area is removed. Whereas the oxide layer on an active region of a small area is remained. A uniformity is thus obtained for chemical-mechanical polishing. Consequently, the recess and misalignment caused by reverse tone effect are avoided.

To achieve these objects and advantages, and in accordance with the purpose of the invention, as embodied and broadly described herein, the invention is directed towards a method of forming a partial reverse active mask. A mask pattern comprising a large active region pattern with an original dimension and a small active region pattern is provided. The large active region pattern and the small active region pattern are shrunk until the small active region pattern disappears. The large active region pattern enlarged to a dimension slightly smaller than the original dimension.

It is to be understood that both the foregoing general description and the following detailed description are exemplary and explanatory only and are not restrictive of the invention, as claimed.

DESCRIPTION OF THE PREFERRED EMBODIMENTS

In the invention, using HDP-CVD incorporating with partial reverse active mask and chemical-mechanical polishing, a shallow trench isolation is formed. The formation of a recess due to misalignment of reverse tone active mask and a short circuit or a leakage current caused by a kink effect caused are avoided.

Figure 1A:
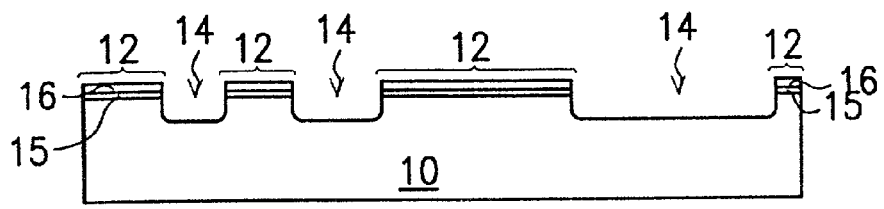
FIG. 1A to FIG. 1E are cross sectional views, on which a conventional method of forming a shallow trench isolation by reverse tone active mask is shown.
Figure 1B:
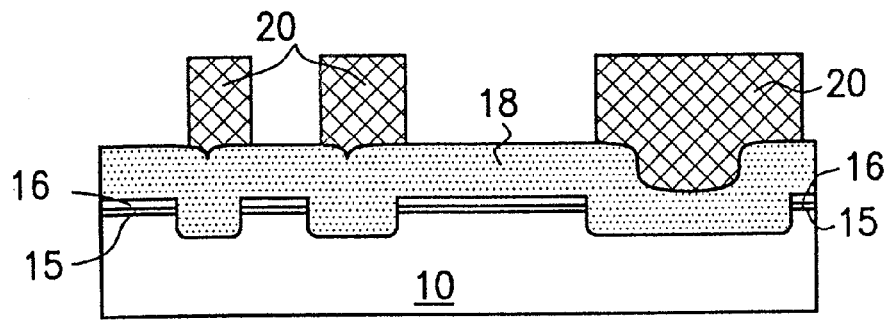
Figure 1C:
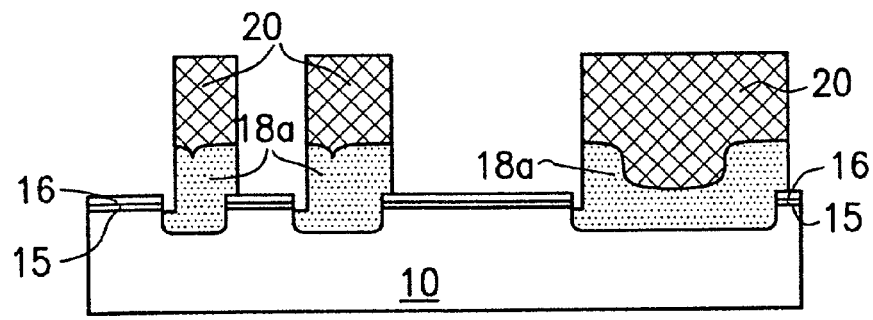
Figure 1D:
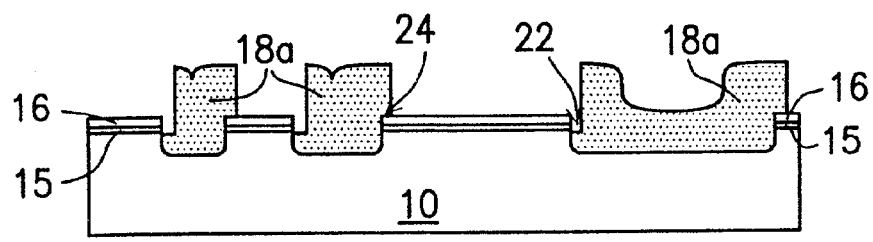
Figure 1E:
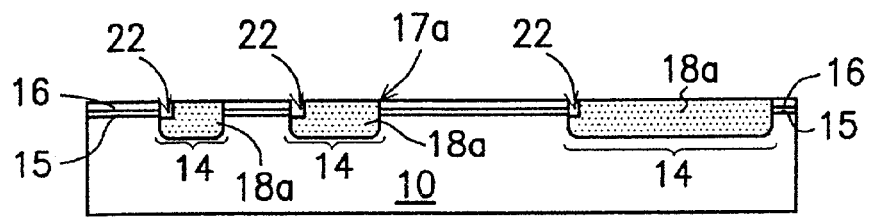
Figure 2A:
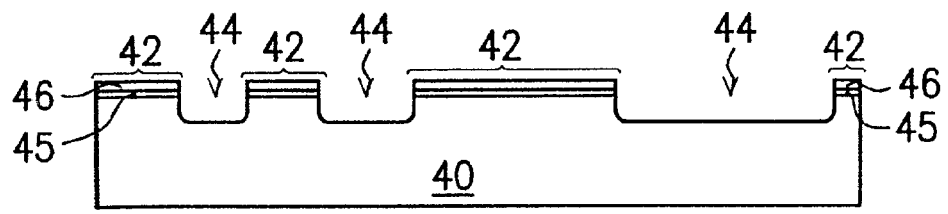
FIG. 2A to FIG. 2E are cross sectional views, on which a method of forming a shallow trench isolation by partial reverse active mask according to the invention is shown.
Figure 2B:
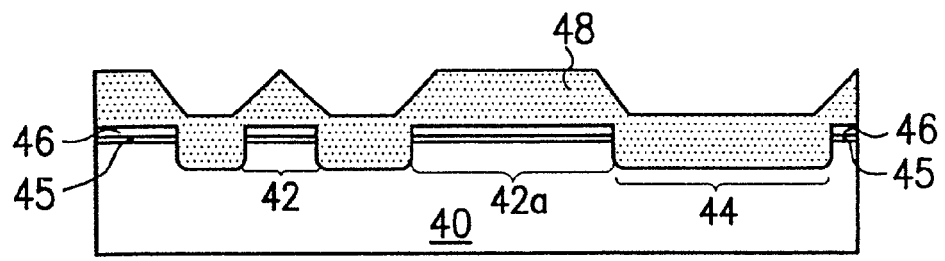

In FIG. 2A to FIG. 2E, a method of forming a shallow trench isolation in a preferred embodiment according to the invention is shown. In FIG. 2A, active regions 42 are formed on a substrate 40. A pad oxide layer 45 and a silicon nitride layer 46 are formed on the substrate 40. Using photolithography and etching, the pad oxide layer 45, the silicon nitride layer 46, and a part of the substrate 40 are defined to form a shallow trench 44 between the active regions 42. The dimension of the shallow trench 44 is variable corresponding to the active regions 42. In FIG. 2B, using HDP-CVD, an oxide layer 48 is formed over the substrate 40. Due to the shallow trench 44, the oxide layer 48 formed by HDP-CVD has a profile, of which a pyramid-like structure is formed on the active regions 42.

Figure 2C:
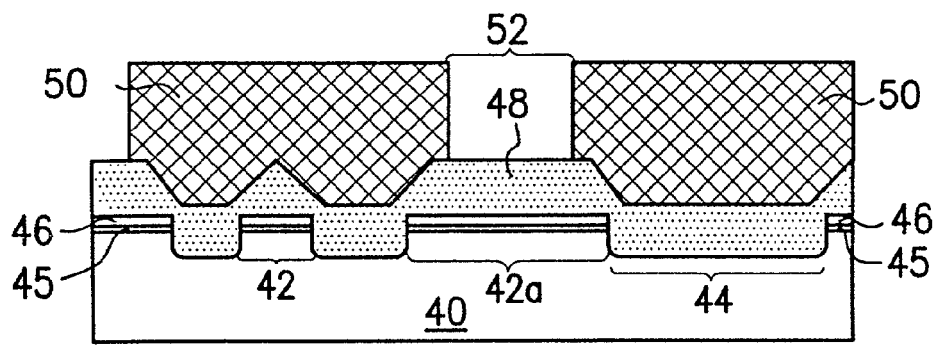

In FIG. 2C, a photo-resist layer is formed on the oxide layer 48. Using photolithography and etching, the photo-resist layer is defined into a partial reverse active mask 50. In addition, an opening 52 formed on a large active region 42a to expose the oxide layer 48 thereon. Since only the oxide layer 48 on the central part of the active region 42a is exposed within the opening 52, even a misalignment occurs to cause a shift of the partial reverse active mask 50, the oxide layer 46 on the shallow trench 44 is not exposed.

Figure 2D:
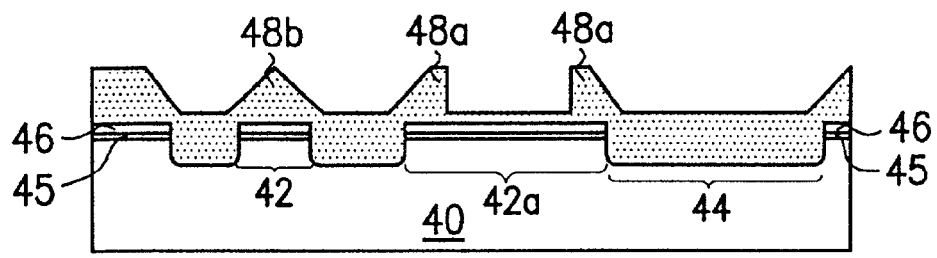

In FIG. 2D, the exposed oxide layer 48 within the opening 52 is etched back until the silicon nitride layer 46 is exposed. The partial reverse active mask 50 is stripped. The remaining oxide layer on the small active region 42 is denoted as oxide layer 48b, whereas the remaining oxide layer on the large active region 42a is denoted as 48a. As mentioned above, the oxide layer 48 is formed by HDCVD, so that the remaining oxide layer 48a and 48b tend to have a pyramid-like profile.

Figure 2E:
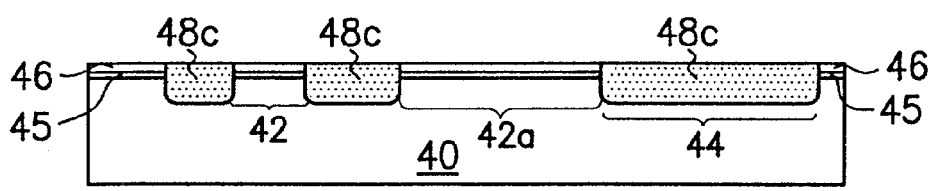

In FIG. 2E, using chemical-mechanical polishing, the oxide layer 48b and the oxide layer 48a are planarized with the silicon nitride layer 46 as an etch stop, so that the oxide layer 48c within the shallow trench 44 has a same level as the silicon nitride layer 46.

Figure 3A:
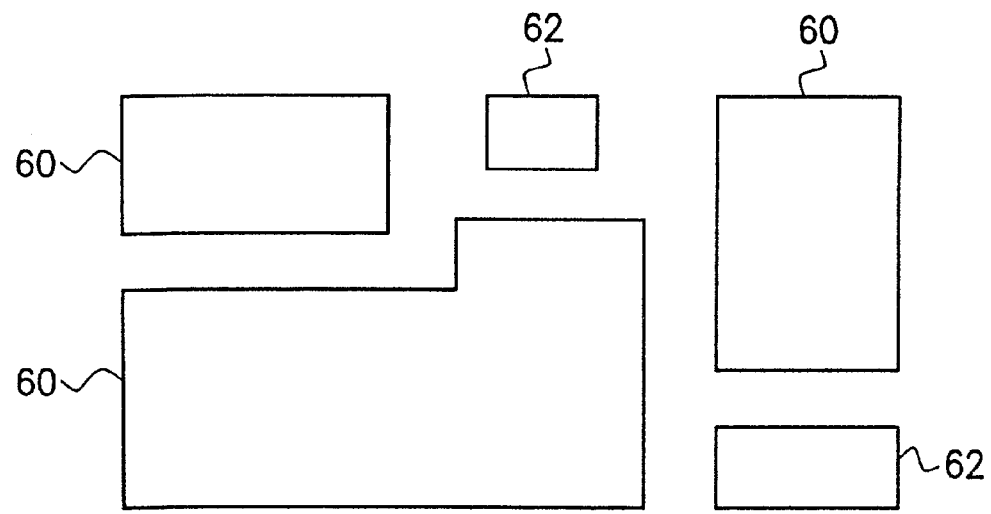
FIG. 3A to FIG. 3D show a method of forming a partial reverse active mask according to the invention.

In the above embodiment, a partial reverse active mask is employed for forming a shallow trench isolation. In FIG. 3A to FIG. 3D, a method of forming a partial reverse active mask is shown. As shown in FIG. 3A, to define a photo-mask pattern, active regions are formed first. The active regions include a large active region pattern 60 and a small active region pattern 62.

Figure 3B:
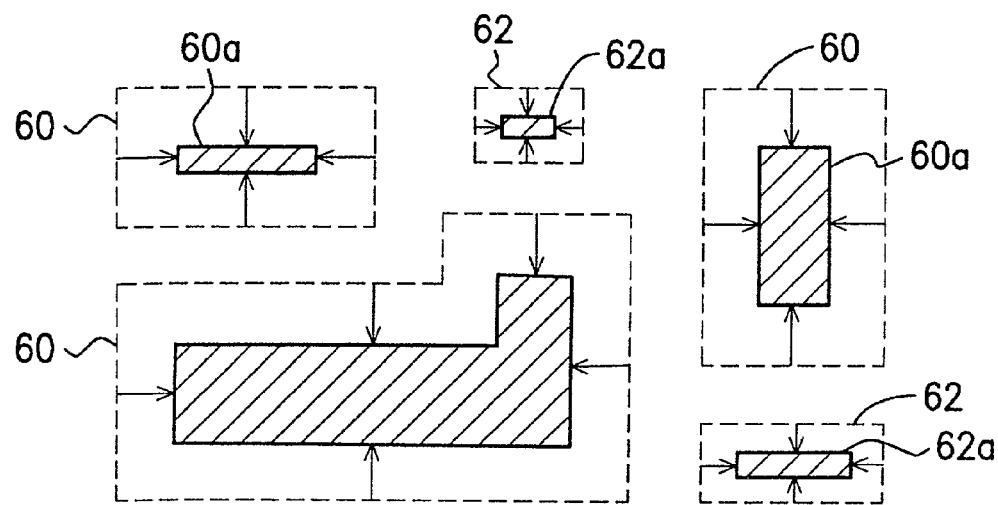

In FIG. 3B, the large active region pattern 60 and the small active pattern region 62 are shrunk as shown in the figure. The shrinking large active region pattern and the shrinking small active region pattern are denoted as 60a and 62a respectively.

Figure 3C:
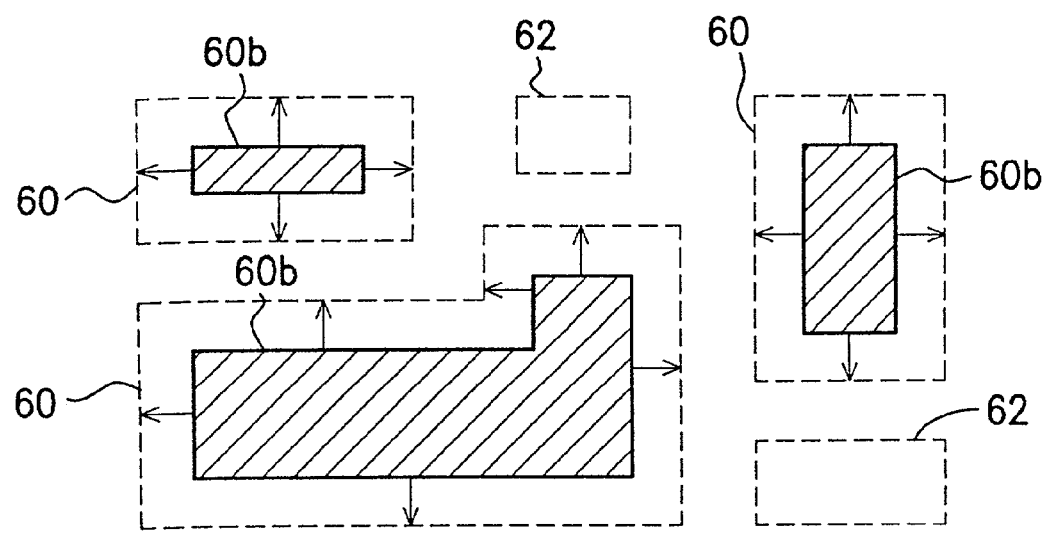

In FIG. 3C, the shrinking process is continued until the shrinking small active region pattern 62a disappears. The shrinking distance is about 0.5 $\mu$m to 2 $\mu$m each side. At this time, only the shrinking large active region pattern 62a is left.

Figure 3D:
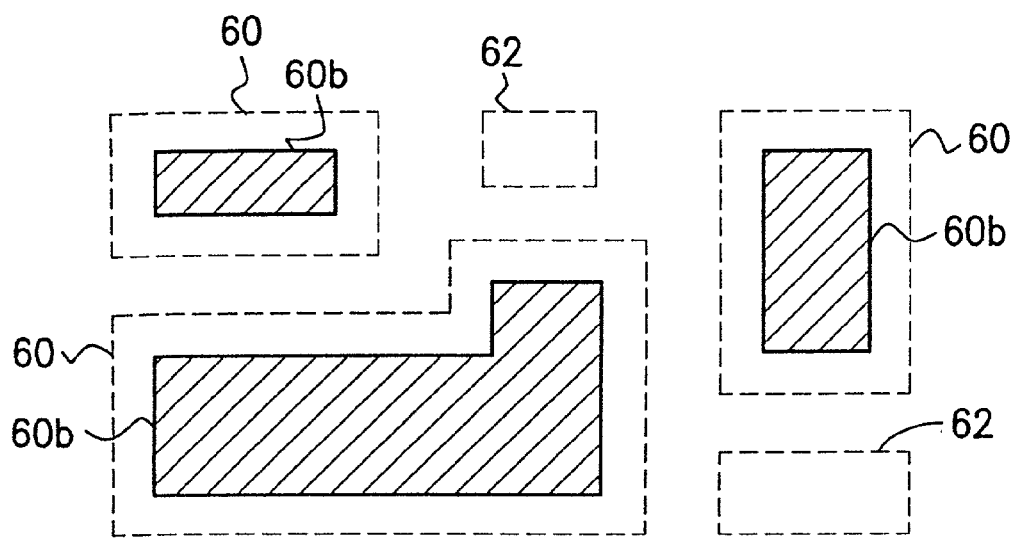

In FIG. 3D, the shrinking large active region pattern 62a is enlarged with a dimension of about 0.2 $\mu$m to 2 $\mu$m each side. This enlarged dimension is smaller than the shrinking distance mentioned above. The resultant active region pattern is shown as the figure and denoted as 60b. It is seen that the resultant active region pattern 60b is slightly smaller than the original active region pattern 60. By applying this photo-mask pattern in forming a shallow trench isolation, the central part of an active region is exposed, whereas the edge part of the active region is covered by a photo-resist. A partial reverse active mask pattern is thus obtained.

The advantages of the invention are:

(1) Using a partial reverse active mask to etch away the oxide layer on the central part of an active region, only the oxide layer on the edge part of the active region and on a small active region is remained. The profile of the remaining oxide layer is pyramid-like and has a better uniformity. Therefore, a recess formed while polishing a large trench is avoided.

(2) Since only the oxide layer on the central part of an active region is etched away by using a partial reverse active mask, even when a misalignment occurs, the oxide layer within the trench is not etched. The kink effect is prevented. As a consequence, the current leakage and the short circuit caused by kink effect are avoided, so that the yield of wafer is enhanced.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of chemical-mechanical polishing for forming a shallow trench isolation, wherein a substrate having a plurality of active regions, including a large active region and a small active region, is provided, comprising:
    forming a silicon nitride layer on the substrate;
    forming a shallow trench between the active regions;
    forming an oxide layer over the substrate, so that the shallow trench is filled therewith;
    removing a rectangular-profiled portion of the oxide layer laterally bounded by a central part of the large active region, whereas the oxide layer remains on an edge part of the large active region and on the small active region having a substantially uniform height; and
    planarizing the remaining oxide layer until the oxide layer within the shallow trench has substantially the same level as the silicon nitride layer.

2. The method according to claim 1, wherein the oxide layer is formed by high density chemical vapor deposition.

3. The method according to claim 1, wherein a partial reverse active mask is formed to etch the central part of the oxide layer on the active region.

4. The method according to claim 1, wherein the oxide layer is planarized by chemical-mechanical polishing.

5. A method of chemical-mechanical polishing for forming a shallow trench isolation, wherein a substrate having a plurality of active regions, including a large active region and a small active region, is provided, comprising:
    forming a silicon nitride layer on the substrate;
    forming a shallow trench between the active regions;
    forming an oxide layer over the substrate, so that the shallow trench is filled therewith;
    forming a partial reverse active mask on the oxide layer, whereas the oxide layer on an edge part of the large active region and on the small active region are covered by the partial reverse active mask;
    etching a rectangular-profiled portion of the oxide layer laterally bounded by a central part of the large active region, using the partial reverse active mask as a mask such that the oxide layer has a substantially uniform height; and planarizing the oxide layer until the oxide layer within the shallow trench has substantially the same level as the silicon nitride layer.

6. The method according to claim 5, wherein the oxide layer is formed by high density chemical vapor deposition.

7. The method according to claim 5, wherein the oxide layer is planarized by chemical-mechanical polishing.

* * * * *

UNITED STATES PATENT AND TRADEMARK OFFICE
CERTIFICATE OF CORRECTION

PATENT NO. : 7,001,713 B2
DATED : February 21, 2006
INVENTOR(S) : Chen et al.

It is certified that error appears in the above-identified patent and that said Letters Patent is hereby corrected as shown below:

<u>Title page,</u>
Item [73], Assignee, "United Microelectronics, Corp." should be -- United Microelectronics Corp. --.

<u>Column 1,</u>
Line 8, after "abandoned" insert -- , which --.
Line 10, "abandoned which claim" should read -- abandoned, which claimed --.

Signed and Sealed this

Second Day of May, 2006

JON W. DUDAS
*Director of the United States Patent and Trademark Office*